United States Patent
Anandan et al.

(10) Patent No.: US 7,071,614 B2
(45) Date of Patent: Jul. 4, 2006

(54) ELECTRON AND HOLE MODULATING ELECTRODES IN ORGANIC LIGHT EMITTING DIODES

(75) Inventors: Munisamy Anandan, Del Valle, TX (US); Ed Sundaram Ramakrishnan, Fremont, CA (US)

(73) Assignee: Organic Lighting Technologies LLC, Austin, TX (US)

( * ) Notice: Subject to any disclaimer, the term of this patent is extended or adjusted under 35 U.S.C. 154(b) by 0 days.

(21) Appl. No.: 10/878,841

(22) Filed: Jun. 26, 2004

(65) Prior Publication Data

US 2004/0263071 A1    Dec. 30, 2004

Related U.S. Application Data

(60) Provisional application No. 60/483,816, filed on Jun. 30, 2003.

(51) Int. Cl.
  *H01J 1/62*   (2006.01)
  *H01J 63/04*  (2006.01)
  *H05B 33/00*  (2006.01)

(52) U.S. Cl. .................. 313/504; 313/506; 313/512

(58) Field of Classification Search ............... 313/506, 313/504, 512; 315/169.3, 169.1; 428/690, 428/917; 257/40
See application file for complete search history.

(56) References Cited

U.S. PATENT DOCUMENTS

| | | | | |
|---|---|---|---|---|
| 6,049,167 A | * | 4/2000 | Onitsuka et al. | 313/512 |
| 6,836,067 B1 | * | 12/2004 | Imai | 313/504 |
| 2004/0046495 A1 | * | 3/2004 | Peng | 313/504 |

* cited by examiner

*Primary Examiner*—Nimeshkumar D. Patel
*Assistant Examiner*—Natalie K. Walford
(74) *Attorney, Agent, or Firm*—Organic Lighting Tech LLC; Michael Graziano

(57) ABSTRACT

An efficient organic light emitting diode (OLED) device—incorporating a stack of thin films comprising a cathode, electron transport layer, hole modulating conductive layer, host layer, electron modulating conductive layer, hole transport layer, hole injection layer and a transparent anode layer—has increased recombination efficiency to generate substantial amount of light. The electron modulating electrode and hole modulating electrode embedded in the stack are applied with appropriate electrical bias to contain the electrons and holes respectively inside the host layer to enhance recombination and consequently light output.

19 Claims, 9 Drawing Sheets

ELECTRON AND HOLE MODULATING ELECTRODES IN ORGANIC LIGHT EMITTING DIODES

CROSS REFERENCE TO RELATED APPLICATION

Benefit of Provisional application No. 60/483,816 filed Jun. 30, 2003. U.S. Pat. No. 6,097,147-Baldo et.al, Aug. 1, 200 U.S. Pat. No. 6,639,357-Parthasarathy et.al, Oct. 28, 2003

OTHER PUBLICATIONS

"Fundamentals of OLED Displays", Short Course S-2, Society for Information Display, SID'03—by Eric Forsythe and Jianmin Shi

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

Certain organic thin films emit light under the action of electric field. If such organic thin film whose thickness is of the order of wavelength of light is sandwiched between a cathode and an anode and applied with a voltage in the range of 5–7 V, substantial amount of light can be generated. Organic light emitting diodes (OLED) are fabricated exploiting this phenomenon of light emission, usually called Electro-luminescence. The basic mechanism, by which the light emission takes place in an organic layer, is through the recombination of electrons and holes in the organic layer. The electrons come in to the organic layer from the cathode that emits and injects electrons in to the organic layer with the help of externally applied electric field. Similarly holes come in to the organic layer from the anode which injects holes in to the organic layer under the action of externally applied electric field. On either side of the organic layer, that emits light, there are other organic layers that transport electrons from the cathode and holes from the anode. For efficient operation of OLED, all the electrons and holes that reach the emissive organic layer should recombine to produce light. Holes need to go up to the emissive organic layer and not beyond. Similarly electrons need to go up to the emissive organic layer and not beyond. Electrons and holes going beyond the emissive organic layer are considered to be a loss because they do not take part in recombination and subsequent emission of light.

To prevent holes from going beyond the emissive organic layer, a 'hole blocking' organic layer is deposited adjacent to the emissive layer, as per the prior art. To prevent electrons going beyond the emissive layer, the hole transport layer, adjacent to the emissive layer towards the anode side, acts as a barrier to electrons. In a practical device, holes and electrons do leak towards the electrodes due to high fields (>$10^6$ V/cm) existing in the device.

This invention relates to the application of electrical bias to the interior of organic stack to repel the holes and electrons crossing the emissive layer and forcing them back to the emissive layer for effective recombination.

Prior arts have dealt with the problem of leakage of holes and electrons beyond the emissive layer relying on the band-gap of hole-transport layer, for electrons, and hole blocking layer, for holes. In one prior art of 2000 (U.S. Pat. No. 6,097,147) Baldo et.al described a 'hole blocking' layer employing thin film of 2,9-dimethyl-4,7-diphenyl-1,10-phenanthrolinr (BCP). This BCP layer had the band gap energy>the energy level of 'excitons' (excited neutral molecule as a result of electron-hole recombination) formed in the emissive layer. This BCP layer was formed between the electron transport layer and emissive layer. However at high operating currents, needed for high brightness, the holes leak through and get collected by the cathode. Similarly the electrons leak through the barrier created by hole transporting layer on the anode side and get collected by anode. Hence barrier offered by the 'blocking layer' is not sufficient at high operating currents. In another invention by Parthasarathy et.al (U.S. Pat. No. 6,639,357) a similar 'hole blocking' layer which also functions as electron transport layer and electron emission layer was employed. The layer is the same as BCP but doped with Lithium (Li) for electron emission. This Li doped layer, in addition to having the same problem of leaking holes to the cathode at high operating currents, also has a problem of Li drift to the emissive layer during operation. Unlike the prior inventions, the present invention controls the loss of electrons and holes through an electrical bias.

BRIEF SUMMARY OF THE INVENTION

According to the present invention, the holes and electrons are forced to confine to the emissive layer through the establishment of an appropriate electric field across the emissive layer. The field can be varied through external bias control. To accomplish this, the present invention incorporates very thin and highly porous electrodes in the organic stack. Taking a conventional 'down emitting' OLED as an example, the anode is of transparent Indium Tin Oxide (ITO) formed on a glass substrate. Successive layers of hole injection, hole transport, light emission, hole blocking, electron transport and electron emissive layers are formed over ITO. There are two conductive layers in this configuration, one being the anode and the other being the cathode. Conductive connections to these layers are extended out of the device. The present invention brings about the elimination of 'hole blocking' layer in the device and instead two additional layers, fairly conductive and partly resistive, are formed on either side of the light emissive layer. These layers are nothing but porous thin metallic films that do not form a continuous sheet (incomplete film growth) but still remaining conductive enough to impress a uniform voltage across the layer. Conductive connections to these two layers are extended out of the device. Hence appropriate electrical bias can be applied to these electrodes to repel the electrons and holes crossing the light emissive layer on either side. The establishment of electric field across the light emissive host layer, through biasing of these layers, is analogous to the electric field across 'depletion region' in a conventional semiconductor Light Emitting Diode (LED). Since these layers are highly porous, the collection of primary electrons and holes by these layers is minimal. Organic materials employed in OLED are generally costly and in this context elimination of 'hole blocking' layer is economical in mass manufacturing. As these conductive layers are thin and porous, the optical transmission is high. It is also possible to have only one conductive layer and bias it relative to anode voltage to repel 'holes' back to the light emissive layer. In this case the optical transmission is higher.

It is an object of this invention to provide electron and hole modulating electrodes that confine the holes and electrons to the light emissive layer by way of applying appropriate electrical bias.

It is another object of this invention to employ the thin film mesh type modulating electrodes to optimize transmission and electrical conductivity.

DETAILED DESCRIPTION

Figure 1:
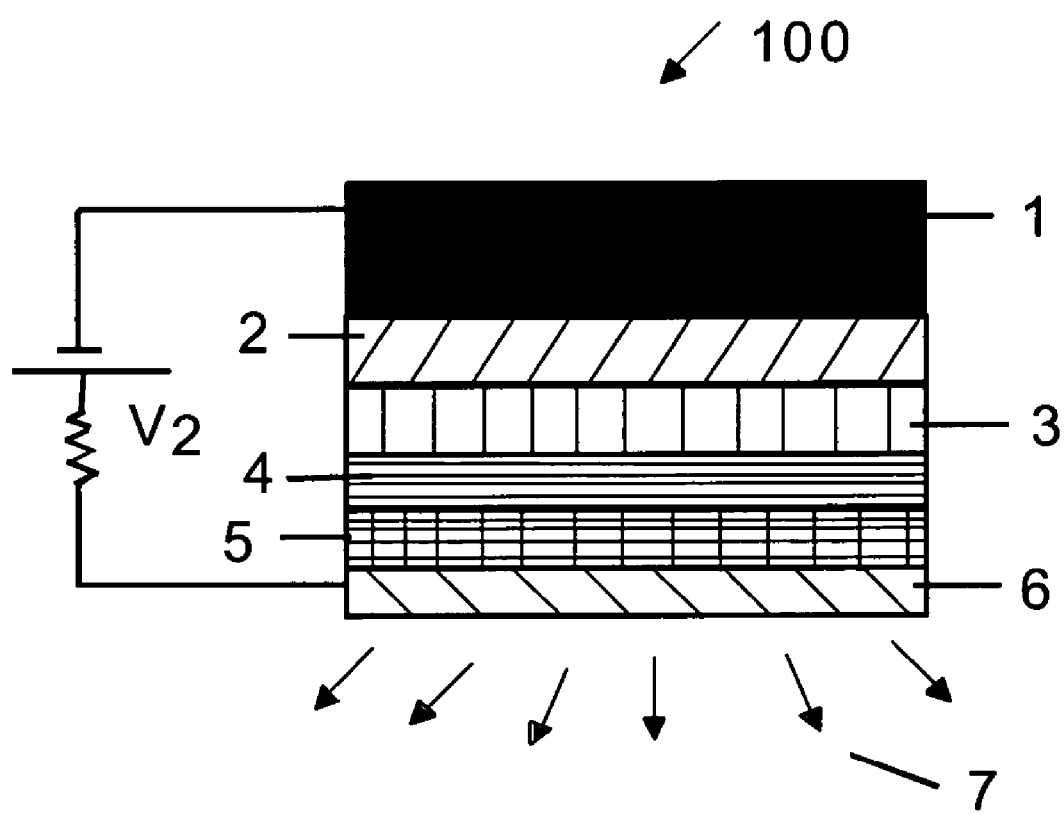
FIG. 1 is the cross section of OLED stack conventionally used in the prior art.

FIG. 1 depicts the cross-section of thin film layers in a conventional OLED structure 100 that is applied with a voltage V2 to emit light. A metallic cathode layer 1 is applied with a small negative voltage and a transparent anode layer 6, that is deposited usually on a glass substrate, not shown in FIG. 1, is applied with a small positive voltage. The organic layer 2 serves as electron transport layer for the electrons emitted from cathode layer 1. Similarly the organic layer 4 functions as hole-transport layer for the holes injected from the organic layer 5. The holes are injected from the anode layer 6, which is transparent in this embodiment. Layer 5 is called hole injection layer and the layer 4 is called hole transport layer. In certain configurations, layer 4 can perform the function of hole-injection and hole transport. When a voltage of sufficient magnitude V2 is applied to the cathode and anode, the holes and electrons are transported to the layer 3, which is called the host layer. The host layer 3 contains miniscule quantity of dopants, usually less than 5%. Total thickness of these layers is of the order of wavelength of light. The electrons and holes in layer 3 recombine to form 'excitons' which are excited molecules of the host material. The 'excitons' spontaneously transition to the ground state emitting radiation. When the host material is doped with dopants, the energy of the 'excitons' is coupled to the dopant material. This forms 'excitons' in the dopant material and these 'excitons' transition to ground state emitting radiation. The radiation travels in all directions. Since the anode is transparent and the cathode is reflective in the example shown in FIG. 1, the light rays 7 exit from the anode side in all angles. This is a 'down emitting OLED structure.

Figure 2:
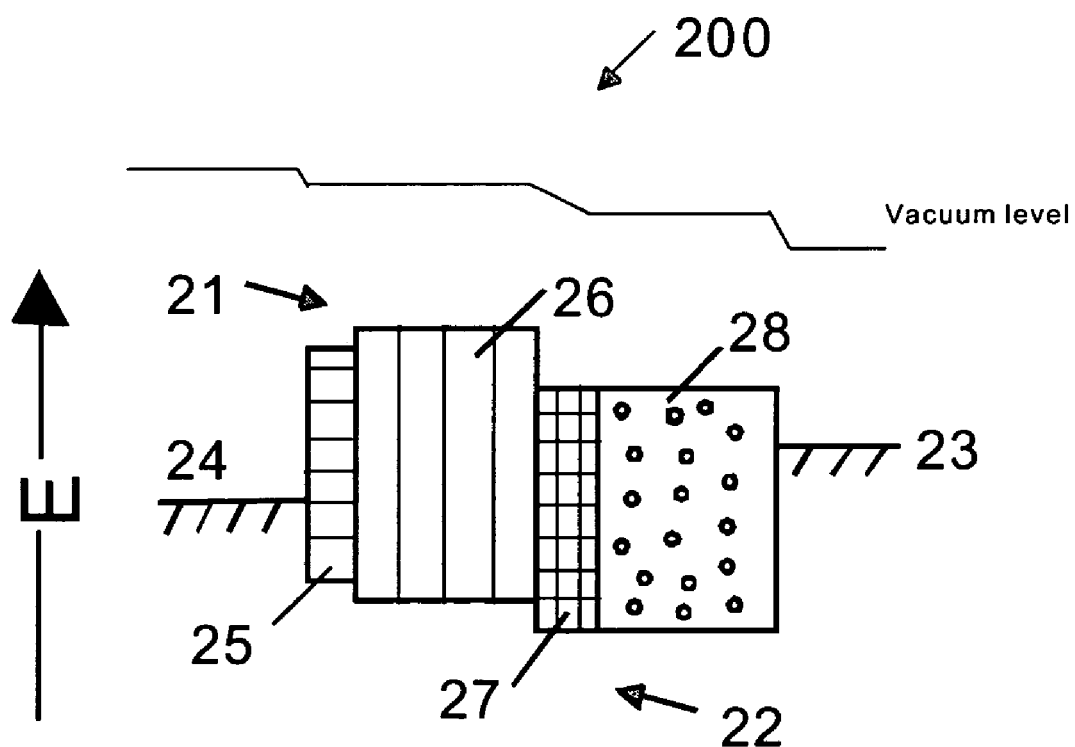
FIG. 2 is the energy level diagram of the materials employed in FIG. 1

FIG. 2 is the energy level diagram 200 of the conventional organic stack shown in FIG. 1, in equilibrium condition. If a voltage is applied to the stack, the band bending takes place and that is not shown in FIG. 2. The LUMO (lowest unoccupied molecular orbital) levels are shown as top horizontal steps 21 for various materials of the stack and the HOMO (highest occupied molecular orbital) are shown as bottom horizontal steps 22 for various materials of the stack. (The vacuum level is the top most stair case structure). Electron-transport takes place at LUMO levels and hole-transport takes place at HOMO levels. There is a barrier for electrons as could be seen from the step in LUMO levels between the cathode 23 and electron transport layer 28. A similar barrier for electrons exists between the LUMO levels of host layer 27 and hole transport layer 26. In the same way, there is a barrier for holes that exists between the HOMO levels of anode 24 and hole injection layer 25. Holes also face a barrier between hole injection layer 25 and hole transport layer 26 and again between hole transport layer 26 and the host layer 27. It can be noted that there is no barrier for holes between host layer 27 and the electron transport layer 28 like the one that exists for electrons between host layer 27 and hole transport layer 26. Under the action of the electric field, substantial number of holes can leak through the host layer because of the absence of any barrier and thus not take part in useful recombination with electrons.

Figure 3:
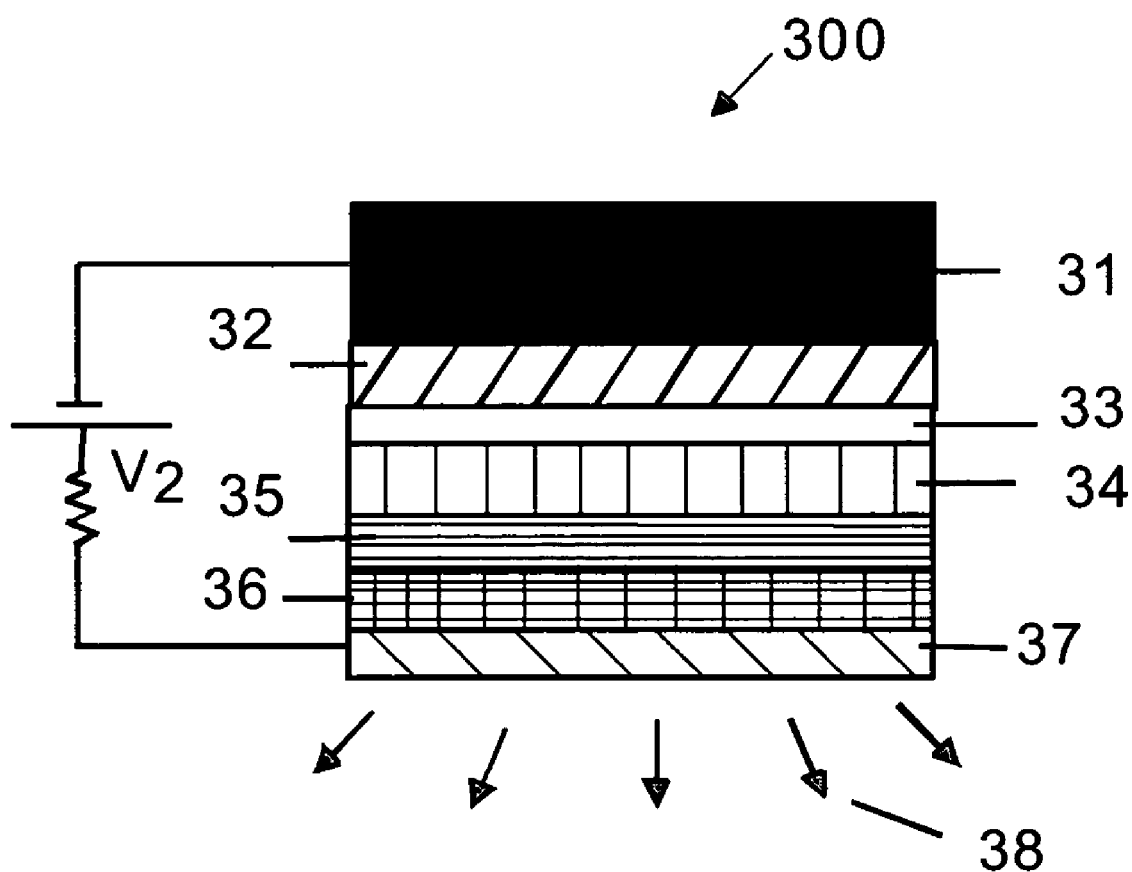
FIG. 3 is the cross section of OLED stack used in another type of prior art.

FIG. 3 is the cross section of thin film organic stack 300 of prior art, which has an additional layer 33 to block the holes leaking towards the cathode 31. With the bias V2 applied the holes are created by anode 37, injected by hole injection layer 36 and transported by hole transport layer 35 to the host layer 34. Similarly the electrons are emitted by cathode 31 and transported to the host layer 34 by both the electron transport layer 32 and hole blocking layer 33. As a result of recombination of holes and electrons in the host layer, light 38 is emitted in all directions through the transparent anode 37. Usually the transparent anode is deposited on a glass substrate, not shown in FIG. 3.

Figure 4:
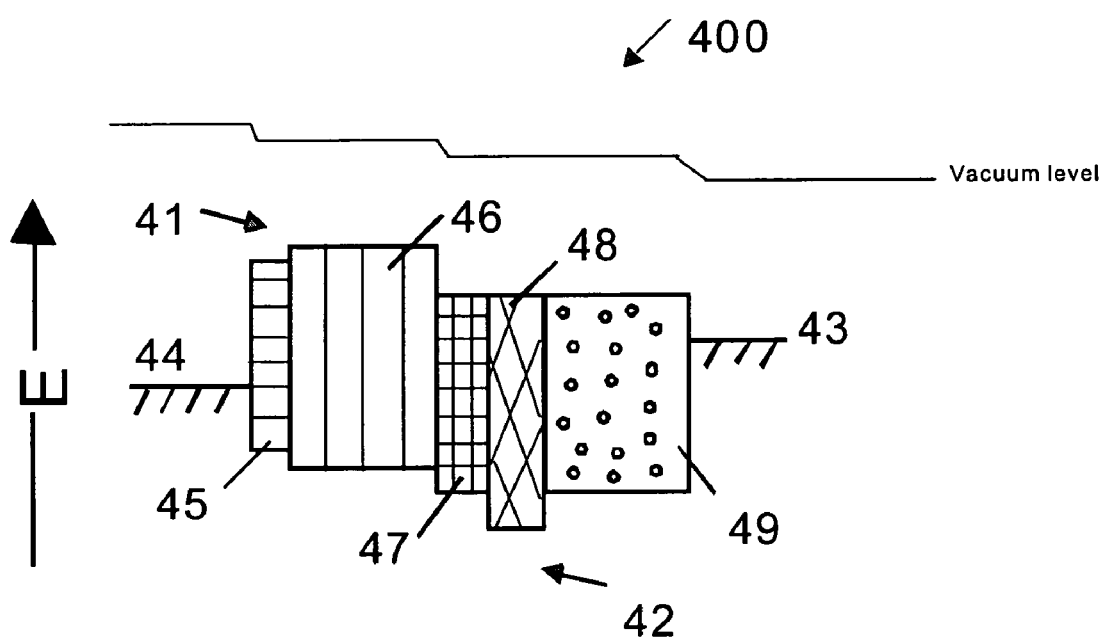
FIG. 4 is the energy level diagram of the materials employed in FIG. 3.

FIG. 4 is the energy level diagram 400 of the material stack depicted in FIG. 3. The top horizontal steps 41, next to vacuum level shows the LUMO levels of the materials. The bottom horizontal steps 42 are the HUMO levels. For electrons, there are energy barriers between cathode 43 and electron transport layer 48 and again between host 47 and hole transport layer 46. For holes there are energy barriers between anode 44 and hole injection layer 45, hole injection layer 45 and hole transport layer 46, hole transport layer 46 and host layer 47 and finally between host layer 47 and hole blocking layer 48. FIG. 4 distinctly differs from FIG. 3 with respect to the hole blocking layer and its barrier for holes crossing the host layer. However, if the current through the stack is increased, 20 mA/cm2 and beyond to obtain substantial brightness increase, the barrier offered by 'hole blocking' layer is not sufficient to prevent the leakage of holes towards the cathode side. Similar is the case for electrons leaking towards anode side.

Figure 5:
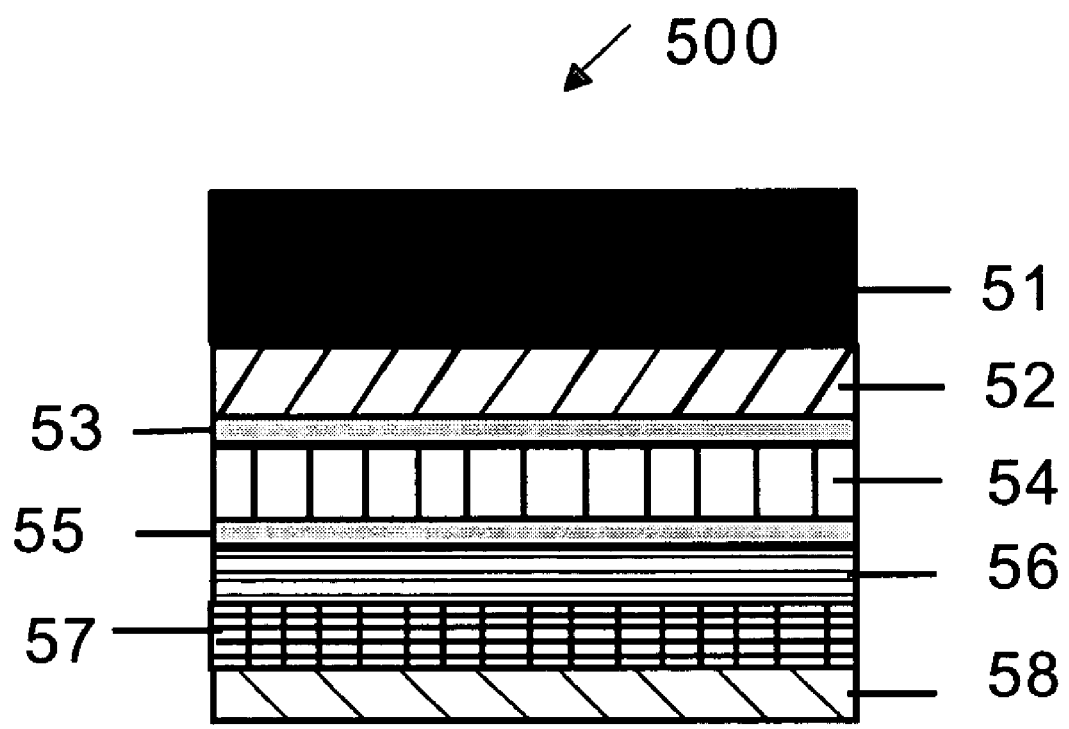
FIG. 5 is the cross section of OLED stack incorporating electron and hole modulating electrodes.

FIG. 5 illustrates the cross section of the stack 500 of thin film layers of the present invention. One distinction of this layer is that it is different from others shown in FIG. 1 and FIG. 3 due to the presence of two conductive layers 53 and 55 disposed on either side of host layer 54. On top of the conductive layer 53 is the electron transport layer 52 followed by the cathode layer 51. Towards the bottom side, following the conductive layer 55 is the hole transport layer 56, hole injection layer 57 and anode 58. The conductive layers 53 and 55 are highly porous but still conductive. The layers can also be of mesh structure. An electrical bias is applied to these thin film conductive layers, called hole and electron modulating electrodes. It is important to emphasize that these conductive layers have to be optically transparent by virtue of its porosity. The porosity and thin nature can also make these layers partially resistive.

Figure 6A:
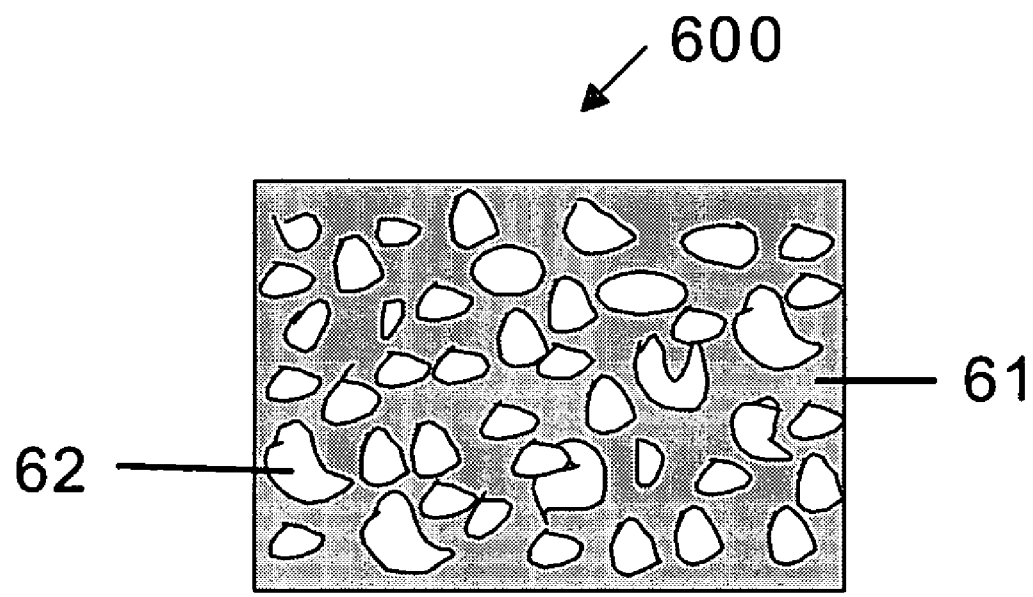
FIG. 6A is the plan view of the film structure of modulating electrode.

FIG. 6A is a plan view 600 of the structure of the conductive thin film layer of both the modulating electrodes. The thin film 61 has continuity but has plenty of pores 62 on its film surface. The film is with full of islands and is not fully grown to form a continuous film. Hence its sheet resistivity can be in the range of 1000 ohms/square. Due to the thinness and porosity, the film is optically transparent.

Figure 6B:
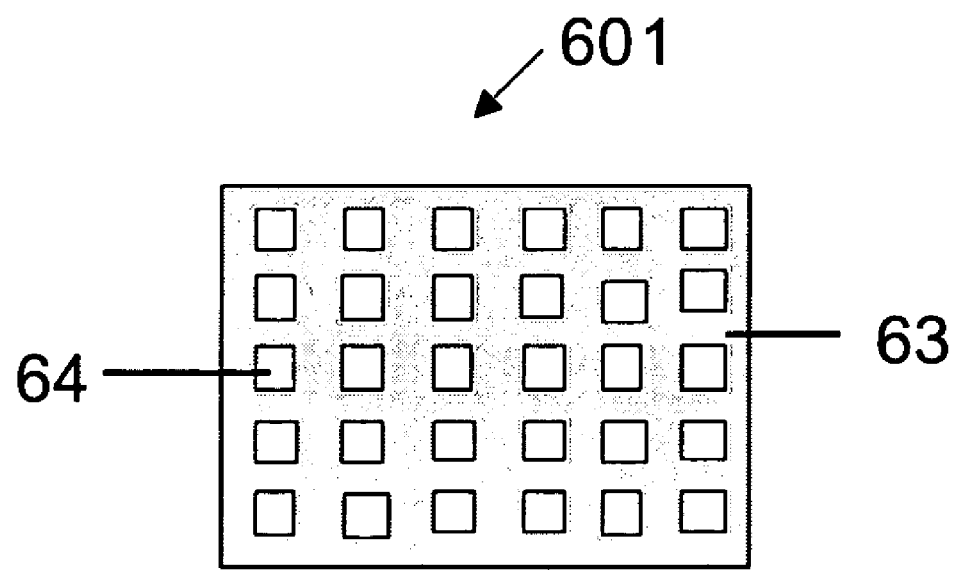
FIG. 6B is the plan view of alternate film structure of modulating electrode.

FIG. 6B is an alternate plan view 601 of the structure of the conductive thin film layer of modulating electrodes. The film 63 has a mesh structure with openings 64 that make the film transparent. The mesh size and the pitch of the openings can be controlled with proper shadow mask while depositing the films during organic thin film processing. These modulating electrodes with high porosity and differing geometry of pores can be processed for very large area pixels of OLED. For example an OLED backlight device for Liquid Crystal Display or an OLED device for consumer lighting.

Figure 7:
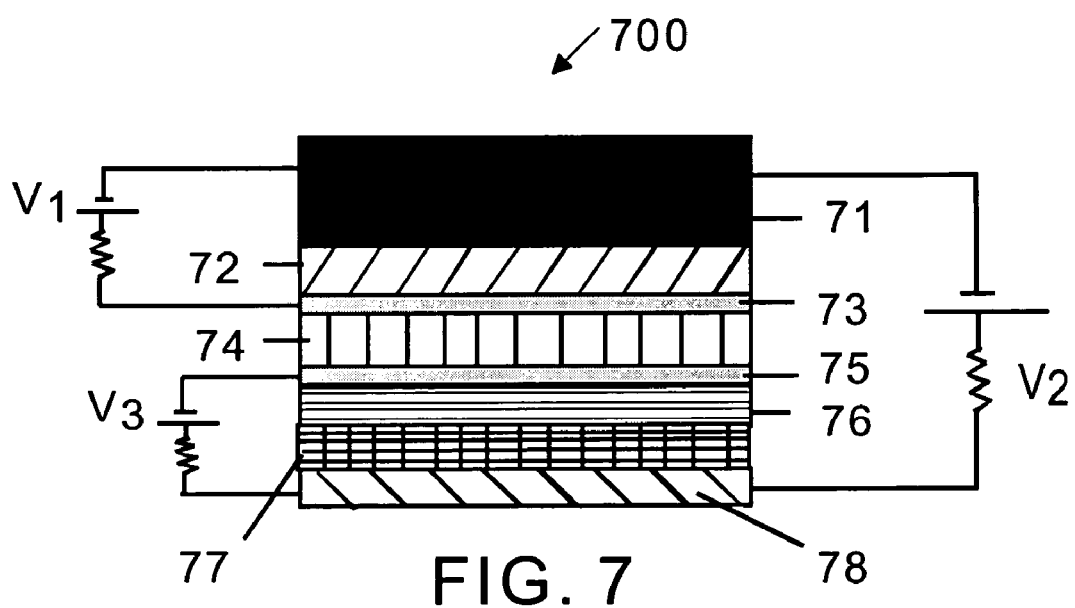
FIG. 7 is the individual biasing scheme for electron and hole modulating electrodes.

FIG. 7 is the cross section of OLED structure 700, incorporating modulating electrodes and the biasing scheme. A voltage of V2 is applied across cathode 71 and anode 78. This voltage V2 is the operating voltage to obtain light emission from OLED. Between the cathode 71 and hole-modulating electrode 73 a voltage of V1 is applied making the hole-modulating electrode positive with respect to cathode. The magnitude of voltage V1 is such that it does not result in breakdown of the electron transport layer 72 or a high leakage through 72 or collection of electrons transported to the host layer 74. The positive voltage, on hole modulating electrode 73, repels the holes, which are positively charged and sends them back to the host layer 74 to take part in recombination to produce more light. A voltage of V3 is applied across anode 78 and electron modulating electrode 75. The magnitude of voltage V3 is such that it does not result in breakdown of the hole transport layer 76 and hole injection layer 77 or high leakage through 76 and 77 or collection of holes transported to the host layer 74. Additionally, the voltage between two modulating electrodes 73 and 75 should not result in breakdown of host layer 74 or high leakage through 74. The negative voltage on the electron modulating electrode 75 repels the electrons and sends them back to the host layer 74 for taking part in recombination to produce more light. In this type of bias scheme a steep I–V characteristics of OLED can be obtained by properly adjusting V1 and V3. Instead of static bias a dynamic bias can also be employed to generate several brightness levels of OLED during operation.

Figure 8:
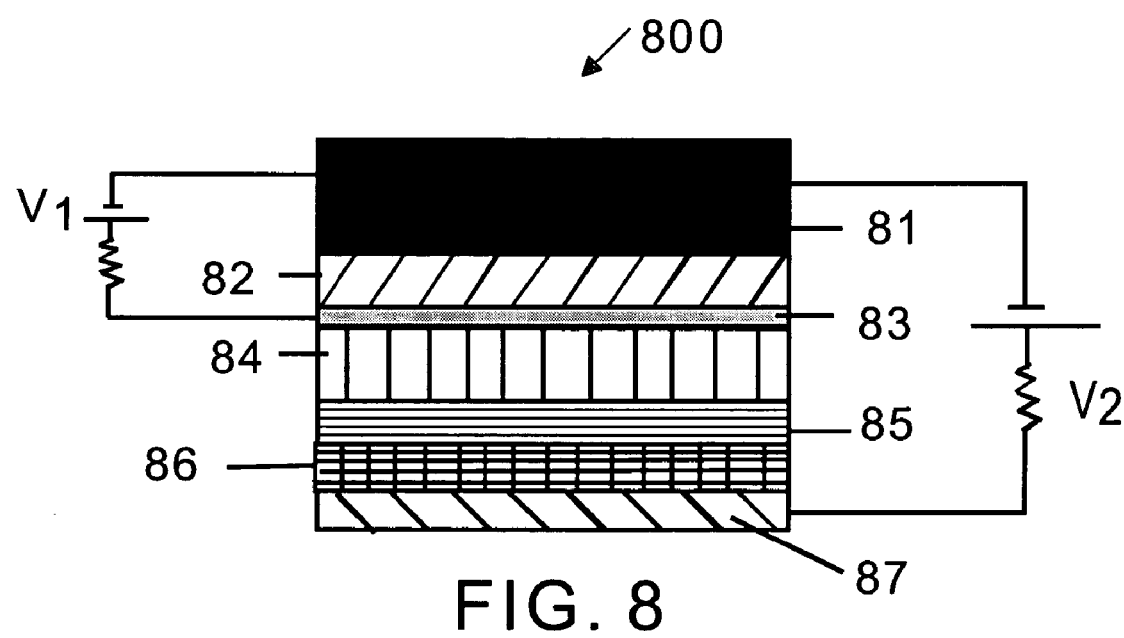
FIG. 8 is another configuration of modulating electrodes.

FIG. 8 is the cross section of alternative OLED structure 800 incorporating hole modulating electrode and its biasing scheme. A voltage of V2 is applied across cathode layer 81 and anode layer 87. This is the main operating voltage for obtaining light emission from OLED. Between the cathode 81 and hole-modulating electrode 83 a voltage of V1 is applied to make hole-modulating electrode 83 positive with respect to cathode 81. The magnitude of voltage V1 is such that it does not result in the breakdown of electron transport layer 82 or high leakage through 82 or collection of electrons being transported to host layer 84. The positive voltage on 83 repels the holes, which are positively charged and sends them back to host layer 84 for taking part in recombination to generate more light. Unlike FIG. 7, in this OLED stack there is no electron-modulating electrode between host layer 84 and hole injection layer 85 that is adjacent to the hole injection layer 86. This stack relies on the energy barrier offered to electrons by the hole-transport layer. The advantage of this stack is the increased optical transparency due to the absence of an electron modulating electrode and the absence of hole blocking layer made of costly organic material.

Figure 9:
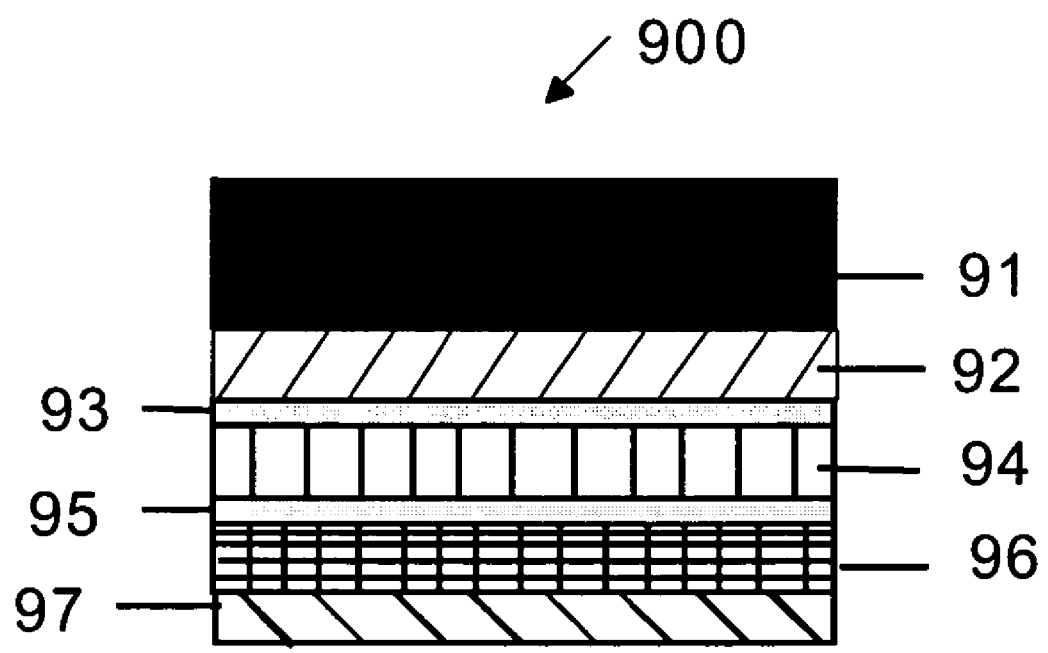
FIG. 9 is another configuration of the structure of OLED stack with modulating electrodes.

FIG. 9 is the cross section of an alternative OLED stack 900 incorporating electron and hole modulating electrodes but omitting hole injection layer. The stack consists of cathode 91 followed by an electron transport layer 92 followed by a hole modulating electrode 93 followed by a host layer 94 followed by an electron modulating electrode 95 followed by a hole transport layer 96 and finally followed by an anode 97.

In all the foregoing embodiments of OLED stack, the electron and hole modulating electrodes can be manufactured by depositing, either by vacuum evaporation or by sputtering, a thin layer to a thickness in the range of 3 nm to 10 nm of metal or metal oxide. For example metals like, Aluminum or Nickel or Chromium or Titanium or Tantalum or combination of Magnesium and Silver or Molybdenum or oxides of metals like Indium Oxide or Zinc Oxide or Indium Tin Oxide or Chromic Oxide can be employed. The modulating electrodes can also be made by heavily doping an organic layer with metals.

It will be apparent to those skilled in the art that various modifications and variations can be made in the construction, processing, configuration and/or operation and application of the present invention without departing from the scope or spirit of the invention. For example, in the embodiments mentioned above in FIG. 9, electron-modulating electrode can be omitted. The OLED stacks illustrated are multi-layer stacks with modulating electrodes. The same modulating electrodes can be employed in a 'Bi-layer' OLED stack. In the same manner, the illustration is for a large area single OLED pixel such as a backlight device for LCD or consumer lighting. With the advancement in patterning technology, the modulating electrodes can be employed in small area pixels as well. Thus it is intended that the present invention covers the modifications and variations of the invention provided they come within the scope of the appended claims and their equivalents.

We claim:
1. An efficient organic light emitting diode device comprising:
   a stack of thin film organic layers and metal layers;
   said thin film layers further comprising a cathode layer followed by an electron transport layer followed by a hole modulating conductive layer followed by a fluorescent or phosphorescent doped light emitting host layer followed by an electron modulating conductive layer followed by a hole transport layer followed by a hole injection layer followed by an anode layer and finally followed by a thick transparent substrate, all remaining in intimate contact with each other;
   said stack hermetically sealed;
   means for externally connecting and applying voltage to said anode, cathode, electron modulating conductive layer and hole modulating conductive layer;
   said electron modulating conductive layer functioning as electron modulating electrode, preventing electrons from leaving the light emitting host layer;
   said hole modulating conductive layer functioning as hole modulating electrode, preventing holes from leaving the light emitting host layer;

said electron modulating electrode, hole modulating electrode, cathode and anode with suitable voltages generating light efficiently in the host layer.

2. An efficient organic light emitting diode device as recited in claim 1 wherein said anode is reflective and said cathode is transmissive or said anode is transmissive and said cathode is reflective or said cathode and anode are both transmissive.

3. An efficient organic light emitting diode device, as recited in claim 1, wherein the electron and hole modulation conductive layers, are made from nickel, molybdenum, aluminum, chromium, tantalum, titanium combination of magnesium and silver, or indium oxide, indium tin oxide, zinc oxide or a conductive organic layer.

4. An efficient organic light emitting diode device, as recited in claim 1, wherein the electron and hole modulating conductive layers are of thin film in the thickness range of 3 nano-meters to 10 nano-meters.

5. An efficient organic light emitting diode device, as recited in claim 4, wherein the electron and hole modulating conductive layers are of thin films of high porosity.

6. An efficient organic light emitting diode device, as recited in claim 5, wherein porous structure of electron and hole modulating conductive layers is random or regular pattern.

7. An efficient organic light emitting diode device, as recited in claim 1, wherein the organic light emitting diode is a bi-layer device or tri- layer device.

8. An efficient organic light emitting diode device, as recited in claim 1, wherein there is an independent bias control for electron modulating electrode and hole modulating electrode.

9. An efficient organic light emitting diode device, as recited in claim 8 wherein a dynamic bias is applied depending on anode to cathode voltage.

10. An efficient organic light emitting diode device, as recited in claim 1, wherein the device is integrated in series or parallel or series parallel arrangement.

11. A backlight device for a liquid crystal display having an efficient organic light emitting diode comprising:
a stack of thin film organic layers and metal layers;
said thin film layers further comprising a cathode layer followed by an electron transport layer followed by a hole modulating conductive layer followed by a fluorescent or phosphorescent doped light emitting host layer followed by an electron modulating conductive layer followed by a hole transport layer followed by a hole injection layer followed by an anode layer and finally followed by a thick transparent substrate, all remaining in intimate contact with each other;
said stack hermetically sealed;
means for externally connecting and applying voltage to said anode, cathode, electron modulating conductive layer and hole modulating conductive layer;
said electron modulating conductive layer functioning as electron modulating electrode, preventing electrons from leaving the light emitting host layer;
said hole modulating conductive layer functioning as hole modulating electrode, preventing holes from leaving the light emitting host layer;
said electron modulating electrode, hole modulating electrode, cathode and anode with suitable voltages generating light efficiently in the host layer.

12. A backlight device for a liquid crystal display having an efficient organic light emitting diode as recited in claim 11 wherein said anode is reflective and said cathode is transmissive or said anode is transmissive and said cathode is reflective or said anode and cathode are both transmissive.

13. A backlight device for liquid crystal display having an efficient organic light emitting diode as recited in claim 11, wherein the said backlight device is integrated in series or parallel or series parallel arrangement.

14. A backlight device for liquid crystal display having an efficient organic light emitting diode as recited in claim 11, wherein the said backlight device is integrated to the said liquid crystal display.

15. A backlight device for liquid crystal display having an efficient organic light emitting diode as recited in claim 11 wherein the said backlight is a planar sheet backlight or integrated strip backlight with Red, Blue and Green colors or monolithic strip backlight with red, blue and green colors.

16. A light source for consumer lighting having efficient organic light emitting diode comprising:
a stack of thin film organic layers and metal layers;
said thin film layers further comprising a cathode layer followed by an electron transport layer followed by a hole modulating conductive layer followed by a fluorescent or phosphorescent doped light emitting host layer followed by an electron modulating conductive layer followed by a hole transport layer followed by a hole injection layer followed by an anode layer and finally followed by a thick transparent substrate, all remaining in intimate contact with each other;
said stack hermetically sealed;
means for externally connecting and applying voltage to said anode, cathode, electron modulating conductive layer and hole modulating conductive layer;
said electron modulating conductive layer functioning as electron modulating electrode, preventing electrons from leaving the light emitting host layer;
said hole modulating conductive layer functioning as hole modulating electrode, preventing holes from leaving the light emitting host layer;
said electron modulating electrode, hole modulating electrode, cathode and anode with suitable voltages generating light efficiently in the host layer.

17. A light source for consumer lighting having an efficient organic light emitting diode as recited in claim 16, wherein said anode is reflective and said cathode is transmissive or said anode is transmissive or and said cathode is reflective or said anode and cathode are both transmissive.

18. A light source for consumer lighting having an efficient organic light emitting diode light source for consumer lighting as recited in claim 17 wherein the said light source is integrated in series or parallel or series parallel arrangement.

19. An efficient organic light emitting diode device as recited in any of claims 1 through 18, wherein said organic light emitting diode is employed in display applications.

* * * * *